United States Patent
Maezawa et al.

(10) Patent No.: US 9,503,811 B2
(45) Date of Patent: Nov. 22, 2016

(54) DIGITAL MICROPHONE AND POSITION-TO-FREQUENCY CONVERTER

(71) Applicants: Koichi Maezawa, Toyama (JP); Koichiro Tanoue, Tokyo (JP)

(72) Inventors: Koichi Maezawa, Toyama (JP); Koichiro Tanoue, Tokyo (JP)

(73) Assignees: Kabushiki Kaisha Audio-Technica, Tokyo (JP); National University Corporation University of Toyama, Toyama (JP)

( * ) Notice: Subject to any disclaimer, the term of this patent is extended or adjusted under 35 U.S.C. 154(b) by 19 days.

(21) Appl. No.: 14/615,471

(22) Filed: Feb. 6, 2015

(65) Prior Publication Data

US 2015/0237442 A1   Aug. 20, 2015

(30) Foreign Application Priority Data

Feb. 18, 2014   (JP) .................................. 2014-028159

(51) Int. Cl.
*H04R 3/00* (2006.01)
*H04R 1/08* (2006.01)

(52) U.S. Cl.
CPC . *H04R 3/00* (2013.01); *H04R 1/08* (2013.01)

(58) Field of Classification Search
CPC ............................... H04R 3/00; H04R 23/004
See application file for complete search history.

(56) References Cited

U.S. PATENT DOCUMENTS

| | | |
|---|---|---|
| 2,494,570 A | 1/1950 | Mezger |
| 4,211,987 A | 7/1980 | Pan |
| 6,362,769 B1 | 3/2002 | Hovin et al. |
| 2004/0178938 A1* | 9/2004 | Pedersen ................. H03M 3/39 341/143 |
| 2009/0232339 A1* | 9/2009 | Motobayashi ........... H04R 1/04 381/369 |
| 2013/0240757 A1* | 9/2013 | Einziger .................. H05B 6/64 250/492.1 |
| 2014/0085020 A1* | 3/2014 | Reinhardt ................ H03H 3/04 333/188 |

FOREIGN PATENT DOCUMENTS

| | | |
|---|---|---|
| DE | 804 445 C | 4/1951 |
| JP | 5162796 | 3/2013 |
| WO | WO 03/075603 | 9/2003 |

* cited by examiner

*Primary Examiner* — Simon King

(74) *Attorney, Agent, or Firm* — Whitham, Curtis & Cook, P.C.

(57) ABSTRACT

A digital microphone includes: a cavity resonator operatable in a micrometer, millimeter, or electromagnetic waveband, the cavity resonator having a metal wall including a conductive membrane 32 that vibrates in response to incident acoustic waves and converts the shift of the membrane 32 into a resonance frequency of the cavity resonator; an FM-signal generator that modulates the resonance frequency of the cavity resonator in response to the shift of the membrane 32 and outputs FM signals from the metal wall other than the membrane; and a ΔΣ-modulated-signal generator that generates ΔΣ-modulated signals from the FM signals. The FM-signal generator includes a slot 36, a micro-strip line 38, and a negative resistive element 40. The ΔΣ-modulated-signal generator includes an edge detector 42.

12 Claims, 5 Drawing Sheets

DIGITAL MICROPHONE AND POSITION-TO-FREQUENCY CONVERTER

BACKGROUND OF THE INVENTION

Technical Field

The present invention relates to a high-resolution digital microphone having wide dynamic range and bandwidth, and a position-to-frequency converter that can serve as a position sensor.

Background Art

Typical condenser microphones include conductive membranes or diaphragms that vibrate in response to the incident acoustic waves, and electrodes fixed so as to face the membranes. Such a membrane and fixed electrodes constitute a capacitor. The condenser microphone includes the capacitor and a buffer amplifier or a preamplifier that reads the variation in capacitance of the capacitor caused by a shift in the membrane.

The recent digitization of acoustic devices often requires the output signals of microphones to be digital signals. In the condenser microphones, analog signals output from the buffer amplifiers or preamplifiers are converted into digital signals with analog-to-digital converters (ADCs). Such a digitizing scheme is a well-known technique and is put to wide practical use.

With reference to FIG. 4, a conventional digital microphone includes an ADC. The main component of the ADC is a delta-sigma ($\Delta\Sigma$) modulator 84. Analog signals 100 or audio signals electro-acoustically converted in a microphone unit (e.g., condenser microphone unit) 80 are sent to the A modulator 84 via a preamplifier 82. The signals output from the $\Delta\Sigma$ modulator 84 pass through a digital filter 86. The $\Delta\Sigma$ modulator 84 operates in synchronization with high-frequency clock signals 102 and converts the analog signals 100 into digital signals 104 modulated by single-bit pulse-density. The $\Delta\Sigma$ modulator 84 includes an integrator, a single-bit quantizer, and a digital-to-analog converter. This configuration is well known, and thus, details of the components will be omitted.

The $\Delta\Sigma$ modulator 84 oversamples the analog signals 100, i.e., samples the analog signals 100 with a frequency significantly higher than the audio signal band, and converts the analog signals into the digital signals 104 modulated by single-bit pulse-density. This process achieves noise-shaping effect, that is, the quantized noise is shifted toward the high frequency band.

PTL 1 describes a digital microphone including a $\Delta\Sigma$ modulator. The digital microphone according to PTL 1 is essentially the same as a typical digital microphone including an ADC. The performance of a digital microphone including an ADC depends on the performance of the ADC, and the performance of the ADC depends on the performance of an analog circuit. A difficult task is designing analog circuits, especially analog circuits having wide bands and wide dynamic ranges for professional use and ultrasonic sensing.

The inventors have proposed a digital microphone that can directly output digital audio signals from the microphone unit and be satisfactorily put to professional use (refer to PTL 2). With reference to FIG. 5 illustrating the digital microphone, a condenser microphone serves as a capacitor that establishes the oscillatory frequency of an oscillator to convert the shift of a membrane in response to incident acoustic waves into frequency.

With reference to FIG. 5, a resonator 12 disposed on a substrate 14 faces a conductive membrane 10. The substrate 14 is secured to a back plate 16. The resonator 12 on the substrate 14 has a wiring pattern on the surface facing the membrane 10. The vibration of the membrane 10 varies the capacitance between the membrane 10 and the resonator 12. The variation in this capacitance causes a variation in the resonance frequency of the resonator 12. The resonator 12 is included in an oscillator that outputs FM signals 110 in response to the vibration of the membrane 10.

The FM signals 110 are sent to a single-bit quantizer 18. The single-bit quantizer 18 samples the FM signals 110 with a high-frequency clock signals 102 and outputs single-bit quantized signals. The single-bit quantized signals are sent to one of the input terminals of an exclusive OR (XOR) circuit 22 directly and to the other input terminal via a resistor 20. The resistor 20 operates in synchronization with the high-frequency clock signals 102 each having a frequency that is the same as the sampling frequency and sends the delayed signals after single-bit quantization to the XOR circuit 22.

The resistor 20 and the XOR circuit 22 constitute an edge detector that detects the edges of the single-bit quantized signals from the single-bit quantizer 18. The output from the XOR circuit 22 is in the form of a $\Delta\Sigma$-modulated signal 112. The single bit output is reduced to the Nyquist rate through a digital filter so as to acquire a digital signal having high resolution and a wide dynamic range.

A conventional digital microphone including a $\Delta\Sigma$ modulator has the advantages described above but also has issues that should be solved. One of such issues is the ready decrease in the Q value of the resonator. The noise floor of a $\Delta\Sigma$ modulation scheme, i.e., the noise level without signal input is determined by the phase noise of the oscillator. Thus, the resonator requires a large Q value. A resonator including a capacitor and an inductor, such as the resonator according to the related art, has a Q value of at most 100, usually in the range of 10 to 20. A relaxation oscillator including a variable capacitor has a smaller Q value and generates larger phase noise.

A second issue concerning a conventional digital microphone including a $\Delta\Sigma$ modulator is the low rate of variation of frequency in response to the shift of a membrane. The membrane of the microphone is fixed at the periphery. Thus, the shift of the peripheral area of the membrane is small compared to the shift of the central area. As a result, a variation in the electrostatic capacitance is small relative to a large shift in the central area. For an LC resonator, the resonance frequency depends on the square root of the product of inductance L and capacitance C. Thus, the variation in frequency is even smaller. The SN ratio and the dynamic range of an ADC including a $\Delta\Sigma$ modulator strongly depend on the frequency modulation width. Thus, the small variation in frequency interferes with the enhancement of the SN ratio and the dynamic range.

CITATION LIST

Patent Literature

[PTL 1] Japanese Translation of PCT International Application Laid-Open No. 2005-519547
[PTL 2] Japanese Patent No. 5162796

SUMMARY OF THE INVENTION

Technical Problem

An object of the present invention is to provide a digital microphone and a position-to-frequency converter that can generate FM signals through a high-rate conversion of the shift of the membrane into frequency modulated signals, and output high resolution, wide dynamic range, and wide band digital signals.

Solution to Problem

A digital microphone according to an embodiment of the present invention is mainly characterized in that it includes a cavity resonator operatable in a micrometer, millimeter, or electromagnetic waveband, the cavity resonator comprising a metal wall comprising a conductive membrane that vibrates in response to incident acoustic waves and converts the shift of the membrane into a resonance frequency of the cavity resonator; an FM-signal generator that modulates the resonance frequency of the cavity resonator in response to the shift of the membrane and outputs FM signals from the metal wall other than the membrane; and a ΔΣ-modulated-signal generator that generates ΔΣ-modulated signals from the FM signals.

A position-to-frequency converter according to an embodiment of the present invention includes a conductive movable structure in place of the membrane in the digital microphone, the conductive movable structure converting the shift of the conductive movable structure in response to an incident external force into a resonance frequency of the cavity resonator.

Advantageous Effects of Invention

According to the present invention, the combination of a cavity resonator including a conductive membrane or movable structure, an FM-signal generator, and a ΔΣ-modulated-signal generator can generate FM signals through a high-rate conversion of the shift of the membrane or the movable structure into the frequency modulated signals. This can provide high resolution, wide dynamic range, and wide band digital signals.

DESCRIPTION OF THE PREFERRED EMBODIMENT

A digital microphone and a position-to-frequency converter according to embodiments of the present invention will now be described with reference to the accompanying drawings.

First Embodiment

Figure 1:
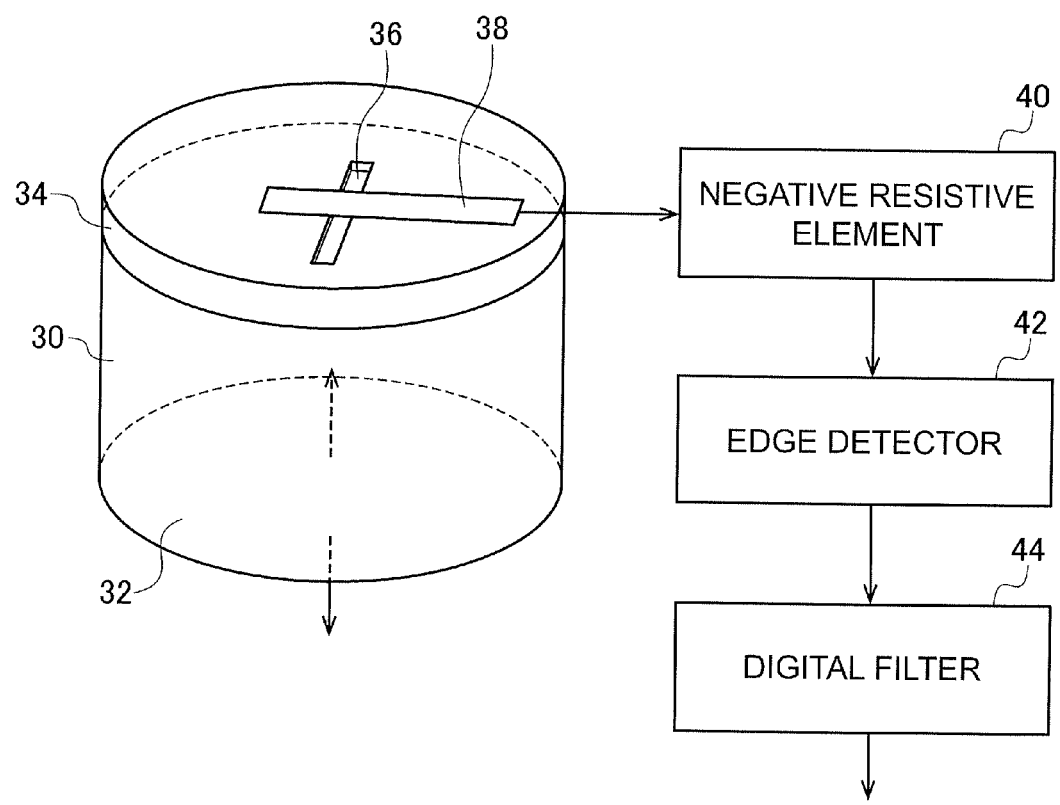
FIG. 1 is a perspective view and a block diagram illustrating the outline of a digital microphone and a shift-to-frequency converter according to an embodiment of the present invention.

FIG. 1 illustrates a cylindrical waveguide 30. The waveguide 30 is composed of metal and has a metal wall. One of the ends of the waveguide 30 along the central axis is covered with a conductive membrane 32 that vibrates or is displaced in response to incident acoustic waves. The other end of the waveguide 30 is covered with a conductive plate 34. The external surface of the conductive plate 34, which is remote from the surface of the conductive plate 34 facing the membrane 32, has a dielectric layer.

A micro-strip line 38 is radially disposed on the dielectric layer of the conductive plate 34. The micro-strip line 38 is connected to a negative resistive element 40. The conductive plate 34 has a slot 36 along a direction intersecting the micro-strip line 38, which in the drawing is the direction orthogonal to the micro-strip line 38. The waveguide 30 having such a configuration operates as a cavity resonator in a micrometer, millimeter, or electromagnetic waveband. The slot 36 electromagnetically connects the electromagnetic field in the cavity resonator and the micro-strip line 38.

Figure 3:
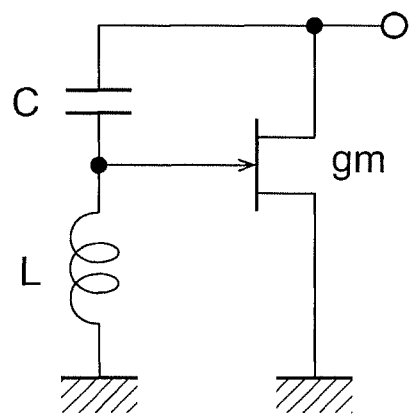
FIG. 3 is a simplified circuit diagram illustrating an example negative resistive element for an oscillator.
Figure 4:
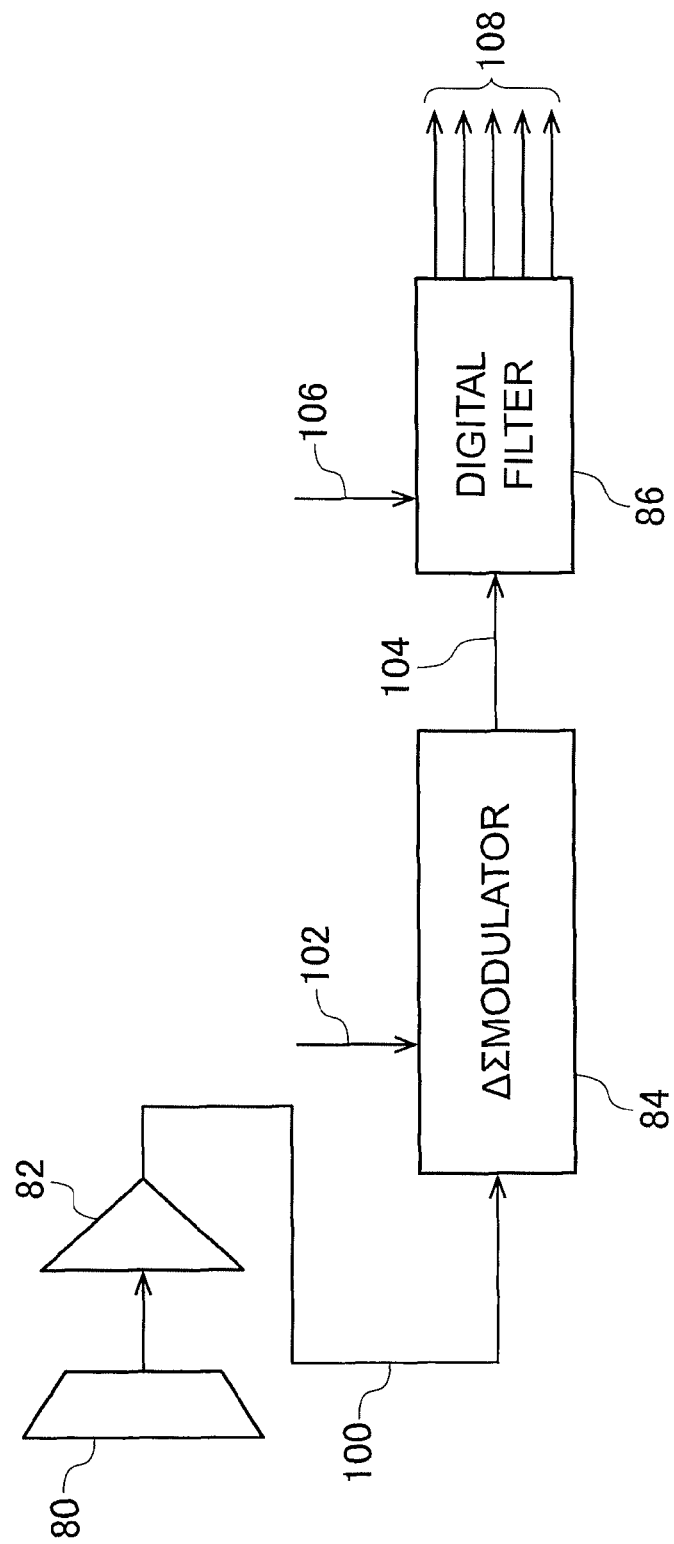
FIG. 4 is a block diagram illustrating a conventional digital microphone including a ΔΣ modulator.

The negative resistive element 40 includes an active device, such as a bipolar transistor and a field-effect transistor (FET). The negative resistive element 40 and the cavity resonator including the waveguide 30 together function as an oscillator. An example negative resistive element included in the oscillator is illustrated in FIG. 3. The waveguide 30 functioning as a cavity resonator has an inductor L and a capacitor C illustrated in FIG. 3. The negative resistive element 40 for keeping the inductor L and the capacitor C in resonance includes an active device gm. The active device in this circuit is an FET.

The oscillatory frequency of the oscillator corresponds to those of the acoustic waves modulated by the vibrating membrane 32. Thus, the oscillator outputs FM waves or signals i.e., the modulated acoustic waves. The slot 36, the micro-strip line 38, and the negative resistive element 40 constitute an FM-signal generator that modulates the resonance frequency of the cavity resonator in response to the shift in the membrane 32 and outputs FM signals. The FM-signal generator outputs the FM signals from the metal wall of the cavity resonator other than the membrane 32.

Figure 5:
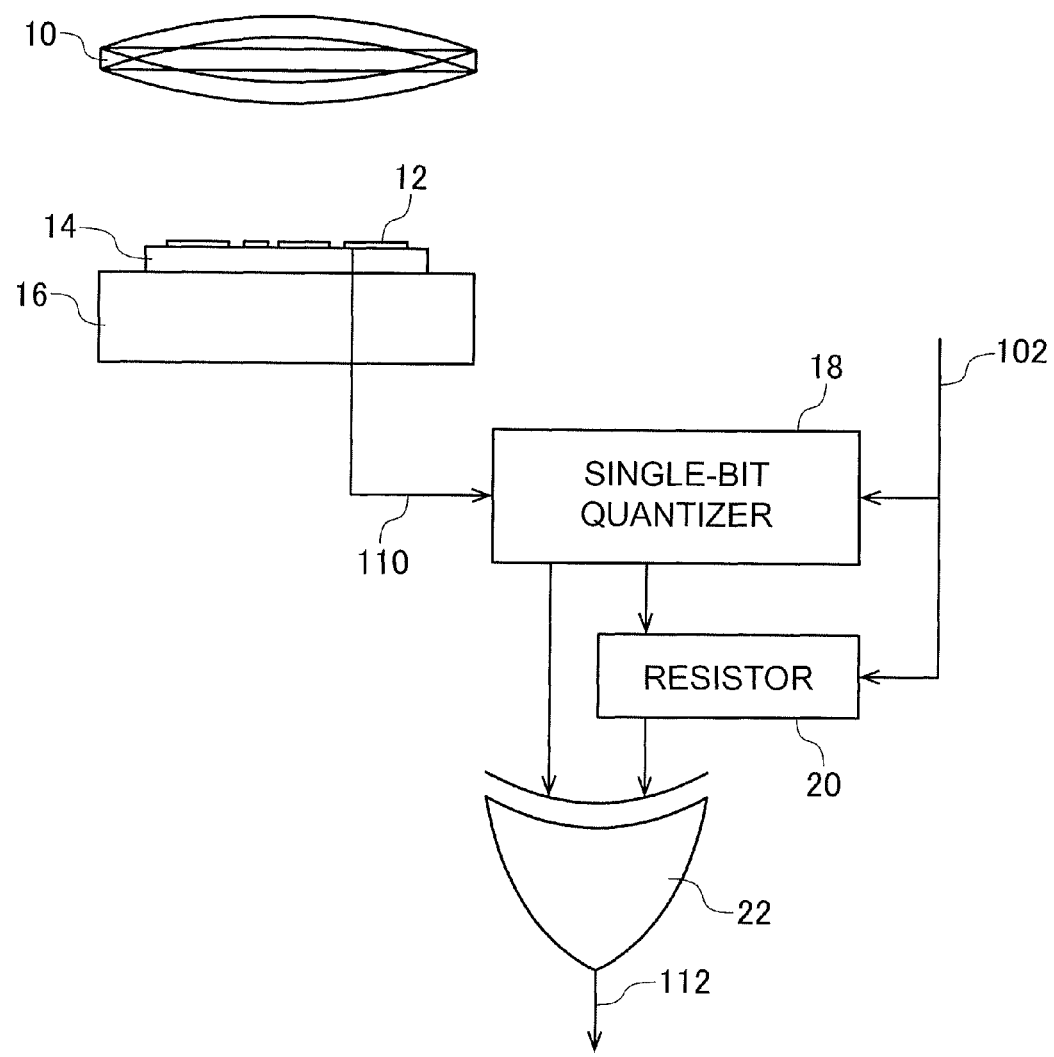
FIG. 5 is a block diagram illustrating another conventional digital microphone including a ΔΣ modulator.

The generated FM waves pass through an edge detector 42 to be converted into ΔΣ-modulated signals. That is, the edge detector 42 illustrated in FIG. 1 serves as a ΔΣ-modulated-signal generator. With reference to FIG. 5, the edge detector 42 includes a single-bit quantizer, a resistor, and an XOR circuit. The single-bit quantizer samples the FM signals with high-frequency clock signals and outputs single-bit quantized signals. The ΔΣ-modulated signals output from the edge detector 42 are sent to a digital filter 44. The digital filter 44 removes high-frequency noise from the ΔΣ-modulated signals.

The operation and advantages of the first embodiment will now be described. The cylindrical waveguide 30 operates as a cavity resonator in a micrometer, millimeter, or electromagnetic waveband. The resonance frequency of the waveguide 30 is given by a function of the position of the membrane 32. The resonance mode of the waveguide 30 illustrated in FIG. 1 is given by TE11n, where n is a natural number. The electromagnetic field is intense near and at the central axis of the cavity resonator. Thus, the resonance frequency responds sensitively to the shift of the central area of the membrane 32. The electromagnetic field is weak in the peripheral area of the membrane 32, i.e., the area near the wall of the waveguide 30. Thus, a hole formed in this area has a small negative impact on the electromagnetic field. A hole for the adjustment of the strength of an air spring, which operates during the vibration of the membrane 32, should be formed in the peripheral area of the membrane 32.

In general, the Q value of the cavity resonator is significantly greater than that of a resonator including independent devices, such as a capacitor and an inductor. Thus, the resonator according to this embodiment has a significantly high Q value and provides significantly low phase noise.

The ΔΣ-modulated single-bit digital signal from the edge detector 42 has its high-frequency noise removed through the digital filter 44 and is converted into a multi-bit digital signal having a Nyquist rate. The multi-bit digital signal has a wide dynamic range and frequency band, and a satisfactory SN ratio. Accordingly, the digital microphone of the embodiment illustrated in FIG. 1 provides a high performance.

A resonance mode where n exceeds one can generate high-frequency oscillation. A high oscillation frequency leads to a large variation in the oscillation frequency in response to the shift of the membrane 32. This provides a higher performance of the digital microphone. The natural number n can be increased through the adjustment of the frequency range in which the negative resistive element 40 generates negative resistance and the formation of a conductive, dielectric, or magnetic structure in the cavity resonator.

In the digital microphone described above, the frequency of the FM signal varies in response to the shift of the membrane 32. Thus, the position of the membrane 32 can be determined from the frequency of the FM signal. Alternative to the membrane 32 illustrated in FIG. 1, the digital microphone may include a movable structure that shifts in response to an external force. In this way, the digital microphone can function as a position-to-frequency converter that converts the position of the movable structure into frequency.

The position-to-frequency converter may also serve as a position-to-digital converter, a digital position sensor, or a pressure sensor. In the position-to-frequency converter functioning as a digital position sensor, the movable structure should move with a moving target having the sensor. In the position-to-frequency converter functioning as a pressure sensor, the movable structure should shift in response to pressure.

The slot 36 and the micro-strip line 38 may be disposed anywhere on the metal wall of the waveguide 30 included in the cavity resonator, other than the membrane 32 or movable structure. The conductive membrane or movable structure may be any part of the metal wall of the waveguide 30 included in the cavity resonator. As illustrated in FIG. 1, it is practical to dispose the membrane 32 or movable structure on one end of the cylindrical waveguide 30.

Second Embodiment

A second embodiment will now be described with reference to FIG. 2. The second embodiment is unlike the first embodiment in that a metal waveguide 50 is shaped as a rectangular or quadrangular prism. One of the ends of the quadrangular waveguide 50 along the central axis is covered with a conductive membrane 52 that vibrates or is displaced in response to incident acoustic waves. The other end of the waveguide 50 is covered with a conductive plate 54. The external surface of the conductive plate 54, i.e., the surface of the conductive plate 54 remote from the membrane 52 has a dielectric layer.

A micro-strip line 58 is disposed across the dielectric layer so as to section the surface of the conductive plate 54 into two areas. The micro-strip line 58 is connected to a negative resistive element 40. The conductive plate 54 has a slot 56 along a direction orthogonal to the micro-strip line 58. The waveguide 50 having such a configuration operates as a cavity resonator. The slot 56 electromagnetically connects the electromagnetic field in the cavity resonator and the micro-strip line 58.

The waveguide 50 according to this embodiment is substantially identical to the waveguide according to the first embodiment, except that the waveguide 50 is shaped as a quadrangular prism. The signal from the negative resistive element 40 is sent to an edge detector 42, and the signal from the edge detector 42 is sent to the digital filter 44. The edge detector 42 and the digital filter 44 are the same as those according to the first embodiment, and thus they are denoted by the same reference numerals.

The quadrangular waveguide 50 operates as a cavity resonator in a micrometer, millimeter, or electromagnetic waveband. The resonance frequency of the waveguide 50 is given by a function of the position of the membrane 52. The resonance mode of the waveguide 50 illustrated in FIG. 2 is given by TE10n, where n is a natural number. Like the first embodiment, the resonance frequency responds sensitively to the shift of the central area of the membrane 52. The electromagnetic field is weak in the peripheral area of the membrane 52. Thus, a hole formed in this area has a small negative impact on the electromagnetic field. A hole for the adjustment of the strength of an air spring, which operates during the vibration of the membrane 52, should be formed in the peripheral area of the membrane 52.

A ΔΣ-modulated single-bit digital signal is output from the edge detector 42. This single-bit digital signal has its high-frequency noise removed through the digital filter 44 and is converted into a multi-bit digital signal having a Nyquist rate. This multi-bit digital signal has a wide dynamic range, a wide frequency band, and a satisfactory SN ratio and provides a high performance to the digital microphone. The natural number n of the resonance mode should preferably be a large number like that in the first embodiment.

Figure 2:
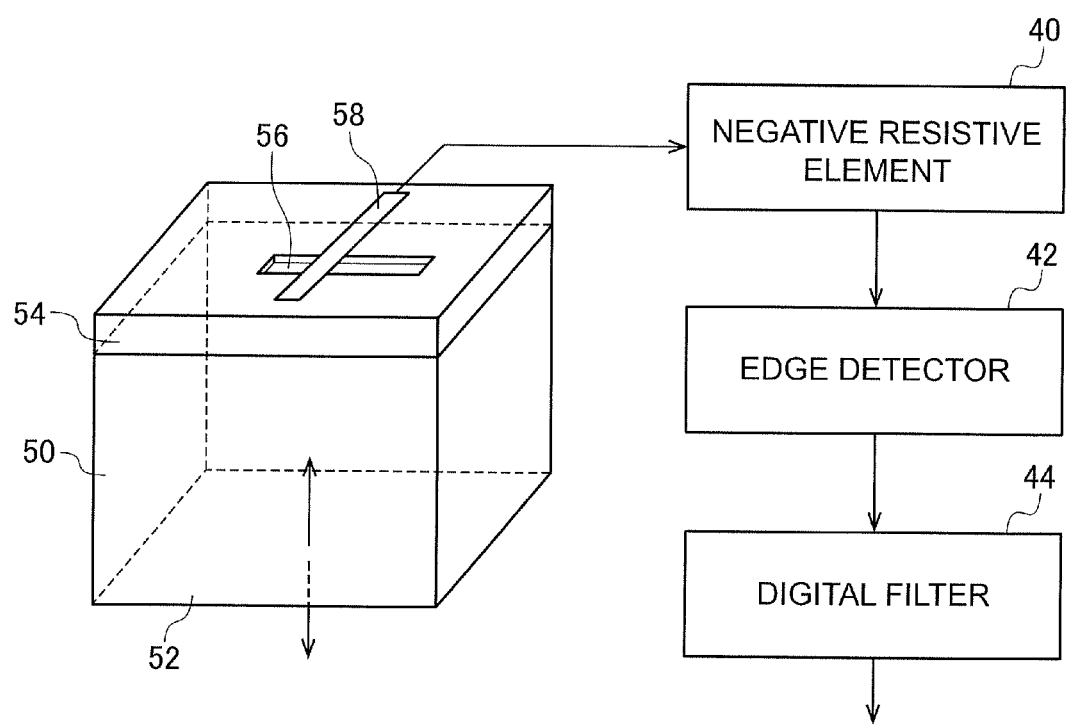
FIG. 2 is a perspective view and a block diagram illustrating the outline of a digital microphone and a shift-to-frequency converter according to another embodiment of the present invention.

As illustrated in FIG. 2, the membrane 52 is disposed opposite to the micro-strip line 58. The present invention should not be limited to this configuration. Alternatively, the membrane 52 may be disposed on one side of the quadrangular waveguide 50. Alternatively, multiple membranes 52 may be disposed on multiple sides of the waveguide 50, and an FM-signal generator may be disposed on at least one of the remaining sides. This configuration can increase the conversion rate of acoustic waves to frequency signals corresponding to the acoustic waves.

The digital microphone according to the second embodiment has a high performance and can serve as a position-to-frequency converter. The position-to-frequency converter may also serve as a position-to-digital converter, a digital position sensor, or a pressure sensor.

Modifications

The cavity resonator may be connected to the micro-strip line with any connection other than a slot; for example, a probe, a loop, or hole coupling. Any resonance mode may be applied other than those according to the first or second embodiment. For example, the resonance mode may be the TE011 mode of a cylindrical cavity resonator, which is known to have a significantly large Q value. In such a case, the connection should prevent the excitation of the degenerated TM111 mode.

The digital microphone including a cavity resonator according to the embodiments described above detects the shift in the membrane as a variation in the resonance frequency of the cavity resonator, not as a variation in capacitance. Thus, unlike a condenser microphone, a significantly small distance between the membrane and the opposing lower electrode (fixed electrode) is not required for the digital microphone. This leads to a greater flexibility in design.

What is claimed is:

1. A digital microphone comprising:
   a cavity resonator operatable in a micrometer, millimeter, or electromagnetic waveband, the cavity resonator comprising a metal wall comprising a conductive membrane that vibrates in response to incident acoustic waves and converts vibration of the membrane into a resonance frequency of the cavity resonator;
   an FM-signal generator that modulates the resonance frequency of the cavity resonator in response to the vibration of the membrane and outputs FM signals from a position on the cavity resonator other than the membrane; and
   a ΔΣ-modulated-signal generator that generates ΔΣ-modulated signals from the FM signals.

2. The digital microphone according to claim 1, wherein the ΔΣ-modulated-signal generator comprises a single-bit quantizer that samples the FM signals with high-frequency clock signals and outputs single-bit quantized signals.

3. The digital microphone according to claim 1, wherein the FM-signal generator comprises:
   a conductive plate disposed in an area other than the membrane in the cavity resonator;
   a dielectric layer disposed on the conductive plate;
   a slot in the conductive plate;
   a micro-strip line that intersects the slot and is coupled with micrometer, millimeter, or electromagnetic waves in the cavity resonator; and
   a negative resistive element that is connected to the micro-strip line.

4. The digital microphone according to claim 3, wherein the dielectric layer is disposed on a surface of the conductive plate, the surface being remote from the membrane.

5. The digital microphone according to claim 1, wherein the cavity resonator comprises a cylindrical waveguide having a first end covered with the membrane and a second end comprising the FM-signal generator.

6. The digital microphone according to claim 1, wherein the cavity resonator comprises a prismatic waveguide having a first end covered with the membrane and a second end comprising the FM-signal generator.

7. The digital microphone according to claim 1, wherein the cavity resonator comprises a prismatic waveguide, at least one side of the waveguide comprising the membrane, at least one of the other sides of the waveguide comprising the FM-signal generator.

8. The digital microphone according to claim 1, wherein the cavity resonator comprises a prismatic waveguide, multiple sides of the waveguide each comprising the membrane, at least one of the other sides of the waveguide comprising the FM-signal generator.

9. A position-to-frequency converter comprising:
   a cavity resonator operatable in a micrometer, millimeter, or electromagnetic waveband, the cavity resonator comprising a metal wall comprising a conductive movable structure that shifts in response to an incident external force and converts the shift of the conductive movable structure into a resonance frequency of the cavity resonator;
   an FM-signal generator that modulates the resonance frequency of the cavity resonator in response to the shift of the movable structure and outputs FM signals from a position on the cavity resonator other than the movable structure; and
   a ΔΣ-modulated-signal generator that generates ΔΣ-modulated signals from the FM signals.

10. The position-to-frequency converter according to claim 9, wherein the ΔΣ-modulated-signal generator comprises a single-bit quantizer that samples the FM signals with high-frequency clock signals and outputs single-bit quantized signals.

11. The position-to-frequency converter according to claim 9, wherein the FM-signal generator comprises:
    a conductive plate disposed in an area other than the movable structure in the cavity resonator;
    a dielectric layer disposed on the conductive plate;
    a slot in the dielectric layer;
    a micro-strip line that intersects the slot and is coupled with micrometer, millimeter, or electromagnetic waves in the cavity resonator; and
    a negative resistive element that is connected to the micro-strip line.

12. The position-to-frequency converter according to claim 9, wherein the cavity resonator comprises a cylindrical or prismatic waveguide, at least one surface of the waveguide comprising the movable structure, at least one of the other surfaces of the waveguide comprising the FM-signal generator.

* * * * *